United States Patent
Kusunoki et al.

(10) Patent No.: US 8,492,774 B2
(45) Date of Patent: Jul. 23, 2013

(54) METHOD AND APPARATUS FOR MANUFACTURING A SIC SINGLE CRYSTAL FILM

(75) Inventors: Kazuhiko Kusunoki, Amagasaki (JP);
Kazuhito Kamei, Hyogo (JP);
Nobuyoshi Yashiro, Amagasaki (JP);
Ryo Hattori, Fukuoka (JP)

(73) Assignees: Nippon Steel & Sumitomo Metal Corporation, Tokyo (JP); Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 13/033,767

(22) Filed: Feb. 24, 2011

(65) Prior Publication Data

US 2011/0198614 A1    Aug. 18, 2011

Related U.S. Application Data

(63) Continuation of application No. PCT/JP2009/065080, filed on Aug. 28, 2009.

(30) Foreign Application Priority Data

Aug. 29, 2008  (JP) .................................. 2008-221851

(51) Int. Cl.
*H01L 29/15*    (2006.01)
(52) U.S. Cl.
USPC ....................................... 257/77; 438/105.931
(58) Field of Classification Search
USPC .............. 257/77, E23.118, E21.465; 438/931
See application file for complete search history.

(56) References Cited

U.S. PATENT DOCUMENTS

| | | | | |
|---|---|---|---|---|
| 3,979,271 A | * | 9/1976 | Noreika et al. | 204/192.25 |
| 4,278,708 A | * | 7/1981 | Mikkor et al. | 427/126.1 |
| 4,800,100 A | * | 1/1989 | Herbots et al. | 427/527 |
| 4,897,149 A | * | 1/1990 | Suzuki et al. | 428/698 |
| 5,187,547 A | * | 2/1993 | Niina et al. | 257/77 |
| 5,328,548 A | * | 7/1994 | Tsuji et al. | 117/79 |

(Continued)

FOREIGN PATENT DOCUMENTS

| | | |
|---|---|---|
| JP | 2004-043211 | 2/2004 |
| JP | 2006-298722 | 11/2006 |
| JP | 2008-044809 | 2/2008 |
| JP | 2008-100890 | 5/2008 |

OTHER PUBLICATIONS

D.A. Bauman et al., "Specific Features of . . . In Vacuum", Semiconductors, vol. 35, No. 10, 2001, pp. 1132-1134.

(Continued)

*Primary Examiner* — Fernando L Toledo
*Assistant Examiner* — Mohammed Shamsuzzaman
(74) *Attorney, Agent, or Firm* — Clark & Brody

(57) ABSTRACT

A manufacturing method for a SiC single crystal film which allows stable growth of a SiC epitaxial film with a low doping concentration on a substrate with a diameter of at least 2 inches by the LPE method using a SiC solution in solvent of a melt includes an evacuation step in which the interior of a crystal growth furnace is evacuated with heating until the vacuum pressure at the crystal growth temperature is $5 \times 10^{-3}$ Pa or lower prior to introducing a raw material for the melt into the furnace. Then, a crucible containing a raw material for the melt is introduced into the furnace, a SiC solution is formed, and a SiC epitaxial film is grown on a substrate immersed in the solution.

7 Claims, 2 Drawing Sheets

U.S. PATENT DOCUMENTS

| | | | | |
|---|---|---|---|---|
| 5,922,126 | A * | 7/1999 | Furukawa et al. | 117/54 |
| 6,063,185 | A * | 5/2000 | Hunter | 117/84 |
| 6,086,672 | A * | 7/2000 | Hunter | 117/84 |
| 6,280,496 | B1 * | 8/2001 | Kawai et al. | 75/236 |
| 6,734,461 | B1 * | 5/2004 | Shiomi et al. | 257/77 |
| 7,230,274 | B2 * | 6/2007 | O'Loughlin et al. | 257/77 |
| 8,013,343 | B2 * | 9/2011 | Shiomi et al. | 257/77 |
| 8,025,728 | B2 * | 9/2011 | Ichimura et al. | 117/82 |
| 8,178,001 | B2 * | 5/2012 | Kaneda et al. | 252/301.4 F |
| 2003/0070611 | A1 * | 4/2003 | Nakamura et al. | 117/109 |
| 2003/0232001 | A1 * | 12/2003 | Fujita | 423/445 R |
| 2005/0082564 | A1 * | 4/2005 | Kitaoka et al. | 257/103 |
| 2007/0033810 | A1 * | 2/2007 | Sumiya et al. | 30/165 |
| 2007/0045689 | A1 * | 3/2007 | Lim et al. | 257/295 |
| 2007/0175383 | A1 * | 8/2007 | Fukuda et al. | 117/35 |
| 2007/0196942 | A1 * | 8/2007 | Kitaoka et al. | 438/46 |
| 2007/0209573 | A1 * | 9/2007 | Kusunoki et al. | 117/28 |
| 2008/0128696 | A1 * | 6/2008 | Chiang et al. | 257/48 |
| 2008/0282978 | A1 * | 11/2008 | Butcher et al. | 118/715 |
| 2009/0013924 | A1 * | 1/2009 | Iwai et al. | 117/64 |
| 2009/0038538 | A1 * | 2/2009 | Kaneko et al. | 117/54 |
| 2009/0304975 | A1 * | 12/2009 | Sugimoto et al. | 428/64.1 |
| 2010/0139553 | A1 * | 6/2010 | Yoshida et al. | 117/88 |
| 2010/0230713 | A1 * | 9/2010 | Minemoto et al. | 257/103 |
| 2011/0042686 | A1 * | 2/2011 | Han et al. | 257/77 |
| 2011/0042788 | A1 * | 2/2011 | Satoh et al. | 257/615 |
| 2011/0100292 | A1 * | 5/2011 | Uematsu et al. | 117/58 |
| 2011/0200833 | A1 * | 8/2011 | Kamei et al. | 428/446 |
| 2012/0021553 | A1 * | 1/2012 | Chiang et al. | 438/57 |
| 2012/0074096 | A1 * | 3/2012 | Chiang et al. | 216/37 |
| 2012/0125255 | A1 * | 5/2012 | Saito | 117/78 |
| 2012/0168695 | A2 * | 7/2012 | Yamada et al. | 252/521.5 |
| 2012/0211769 | A1 * | 8/2012 | Kusunoki et al. | 257/77 |

OTHER PUBLICATIONS

S.V. Rendakova et al., "Micropipe and Dislocation . . . Liquid Phase Epitaxy", Journal of Electronic Materials, vol. 27, No. 4, 1998.

N. Kuznetsov et al., "4H-SiC Layers . . . Off-Axis Substrates", Materials Science Forum vols. 338-342 (2000), pp. 229-232.

Vladimir Dmitriev et al., "Growth of SiC . . . liquid phase epitaxy", Journal of Crystal Growth 128 (193) 343-348.

Ikeda M et al., "Fabrication of 6H-SiC . . . electroluminescent mechanisms", Journal of Applied Physics, American Inst. Of Physics, NY, USA, vol. 50, No. 12, Jan. 1, 1979, pp. 8215-8225 XP002523965.

Munch W. V. et al., "Silicon carbide . . . phase epitaxy", Solid State Electronics, Elsevier Science Publishers, Barking, GB, vol. 21, Jan. 1, 1978, pp. 1129-1132, XP002523966.

W.E. Nelson, "Growth and Properties . . . Single Crystals", Journal of Applied Physics, vol. 37, No. 1, Jan. 1, 1966, pp. 333, XP55009214.

Nava F. et al., "Topical Review: Silicon carbide . . . detector material", Measurement Science and Technology, IOP, Bristol, GB, vol. 19, No. 10, Aug. 11, 2008, p. 102001, XP020144236.

V. Dmitriev et al., "Growth of SiC . . . Liquid Phase Epitaxy", Journal of Crystal Growth 128 (1993) 343-348.

Dmitriev, "Silicon carbide . . . liquid-phase epitaxy", Physica B. 185 (1993) 440-452.

* cited by examiner

METHOD AND APPARATUS FOR MANUFACTURING A SIC SINGLE CRYSTAL FILM

TECHNICAL FIELD

This invention relates to a method and apparatus for manufacturing a thin film of a silicon carbide single crystal (a SiC single crystal film) by epitaxial growth. More specifically, the present invention relates to a method and apparatus for manufacturing a SiC single crystal film which particularly enables stable growth of a high purity SiC single crystal epitaxial film having a low doping concentration with nitrogen donors on a single crystal substrate (such as a SiC wafer) having a diameter of at least 2 inches.

By using the method of the present invention, a silicon carbide single crystal epitaxial wafer having decreased crystal defects and SiC semiconductor products such as silicon carbide (SiC) semiconductor devices of high reliability can be realized with high productivity. This invention also relates to such a product.

BACKGROUND ART

Silicon carbide (SiC) is one of compound semiconductors and is thermally and chemically stable. Compared to silicon (Si), SiC has advantageous physical properties such as a band gap which is approximately three times as large, a dielectric breakdown voltage which is approximately ten times as large, an electron saturation speed which is approximately twice as large, and a coefficient of thermal conductivity which is approximately three times as large. On account of these excellent properties, SiC has attracted interest as a material for the next generation of low-loss power devices. In order to manufacture such a device, it is necessary to provide a SiC single crystal wafer with a SiC epitaxial film which is formed by epitaxial growth of a SiC film serving as an active layer of the device on a SiC single crystal substrate. For practical applications, the wafer diameter needs to be at least 2 inches.

SiC is well known as a substance having crystal polymorphism called polytypes. This crystal polymorphism is a phenomenon in which a substance can take a plurality of crystal structures which differ only in the manner of stacking of atoms in the c axis direction while maintaining stoichiometrically the same composition. Typical polytypes of SiC are 6H (a hexagonal crystal having 6 molecules per period), 4H (a hexagonal crystal having 4 molecules per period), 3C (a cubic crystal having 3 molecules per period), and the like. 4H—SiC is said to be particularly preferred for power devices.

In both substrates and epitaxial films, coexistence of two or more polytypes has an adverse effect on device performance. Therefore, good quality SiC single crystals having a pure crystal form (without forming a mixture of different polytypes) and minimized crystal defects are necessary.

Known methods for manufacturing SiC bulk single crystals for use as a SiC single crystal substrate include the sublimation recrystallization method and the solution growth method. Known methods of growing a SiC epitaxial film include the chemical vapor deposition (CVD) method and the liquid phase epitaxy (LPE) method.

Almost all epitaxial film-coated SiC single crystal wafers which are currently commercially available have a substrate portion manufactured by the sublimation recrystallization method and an epitaxial film portion formed by the CVD method (more particularly, by the below-described step-controlled epitaxy technique). Namely, each portion is manufactured using crystal growth from a vapor phase.

In the sublimation recrystallization method which is a manufacturing method for bulk single crystals, a raw material SiC powder is sublimated at a high temperature of 2200-2500° C., and a SiC single crystal is recrystallized on a seed crystal made of a SiC single crystal disposed in a lower temperature region. This method has a high growth rate. However, the SiC single crystal which was grown contains a large number of dislocations and micropipe defects which are propagated from the seed crystal as well as a large number of dislocations which are thought to generate during crystal growth. Accordingly, in the sublimation recrystallization method, it is extremely difficult to obtain a SiC single crystal having a quality significantly superior to that of the seed crystal.

When a SiC bulk single crystal is grown by the solution growth method, carbon is dissolved in a melt of Si or a Si alloy serving as a solvent to prepare a solution of SiC dissolved in the melt. A SiC seed crystal is immersed in this SiC solution, and a state of supersaturation of SiC is formed by supercooling the solution at least in the vicinity of the seed crystal to grow a SiC single crystal on the seed crystal. In order to create the supersaturated state, the so-called temperature difference method in which a temperature gradient is provided so that the temperature of the melt in the vicinity of the seed crystal is lower than that in other areas is typically used. Compared to the sublimation recrystallization method, the solution growth method which employs liquid phase growth can lower the growth temperature by around 500-1000° C.

In the CVD method which is a vapor phase growth method for an epitaxial film, a mixture of a silane gas and a hydrocarbon gas which are raw material gases are thermally decomposed, and a SiC film is deposited on a substrate. This method has the drawback that during the process of forming a SiC single crystal film, two or more polytypes are intermixed in the resulting film. In order to overcome this problem, the step-controlled epitaxy technique in which a substrate having its surface sloped by a few degrees in the (112-0) direction from the c axis (an off-axis or off-oriented substrate) is used to perform the growth in the step-flow mode (lateral growth) of an epitaxial film of the same polytype as the substrate has been proposed.

However, in the step-controlled epitaxy technique using an off-axis substrate, dislocations in the substrate are propagated to the resulting SiC epitaxial film and it is difficult to obtain an epitaxial film having a decreased number of dislocations. In addition, SiC epitaxial films formed by the CVD method in general may include lattice defects such as vacancies or interstitial atoms. With such a film, it is not possible to manufacture a semiconductor device having good properties with respect to breakdown voltage, leak current, and the like.

In the liquid phase epitaxy (LPE) method which forms an epitaxial film in a liquid phase, a SiC single crystal film is formed on a substrate by nearly the same principles as for the solution growth method which grows a bulk single crystal in a liquid phase. Namely, using a SiC solution having a melt of Si or a Si alloy as a solvent, a SiC epitaxial film is grown on a substrate under supersaturation of SiC. In contrast to the CVD method, the LPE method performs crystal growth in a state close to thermodynamic equilibrium, which makes it possible to obtain a SiC epitaxial film having a low density of crystal defects.

Below-identified Non-Patent Document 1 reports that growth of a SiC single crystal by the LPE method on an on-axis (0001) SiC single crystal substrate prepared by the sublimation recrystallization method causes crystal growth to proceed while decreasing micropipe defects and dislocations.

It is speculated that a SiC epitaxial film having improved crystal quality can be formed by that method.

However, although the LPE methods which have been proposed thus far could decrease crystal defects in a SiC epitaxial film, it was difficult to obtain a SiC epitaxial film having a low doping concentration suitable for power devices (specifically, a doping concentration of nitrogen donors of $1 \times 10^{16}/cm^3$ or lower).

In SiC epitaxial growth by the LPE method described in below-identified Non-Patent Document 2, when the growth atmosphere was helium, argon, or a vacuum ($5 \times 10^{-4}$ Pa), the doping concentration of nitrogen donors as background impurities in the resulting SiC epitaxial film was approximately $3 \times 10^{18}/cm^3$, approximately $1 \times 10^{17}/cm^3$, or $2 \times 10^{16}/cm^3$, respectively. This nitrogen concentration is thought to be due to nitrogen gas present in impurity gas components which remain in the atmosphere dissolving in the SiC solution, and dissolved nitrogen atoms being incorporated into the grown crystals as n-type donor impurities. The above-described concentrations of background impurities are high for an epitaxial film for power devices. That document also states that in crystal growth in a vacuum in which the lowest doping concentration of nitrogen donors was achieved, there is violent vaporization of the melt and stable crystal growth is not possible.

Below-identified Non-Patent Document 3 states that a SiC crystal with a doping concentration of $8 \times 10^{15}/cm^3$ can be obtained by the LPE method using Si as a solvent under a vacuum on the order of $5 \times 10^{-5}$ torr, i.e., approximately $6.67 \times 10^{-4}$ Pa. In the LPE method used in that document, a Si melt is not housed in a crucible, and it is upthrusted by electromagnetic force produced by a water-cooled induction coil. After C is dissolved in the melt, a SiC crystal is grown on an extremely small SiC substrate measuring 0.5-1.5 cm². Crystal growth is performed in a vacuum, so as stated above for Non-Patent Document 2, there is a concern of vaporization of the melt. Furthermore, that method has the problem that it is difficult to carry out crystal growth on a SiC substrate having a large area for practical applications. In order to make it possible to use a substrate having a large area, it is necessary to increase the amount of melt which is upthrusted, and for this purpose, a high frequency oscillator of extremely large electric power becomes necessary.

PRIOR ART DOCUMENTS

Non-Patent Documents

Non-Patent Document 1: Journal of Electronic Materials 27 (1998), p. 292
Non-Patent Document 2: Materials Science Forum 338 (2000), p. 229
Non-Patent Document 3: Journal of Crystal Growth 128 (1993), p. 343

SUMMARY OF THE INVENTION

The present invention provides a method and apparatus for manufacturing a SiC single crystal film which can stably form a SiC epitaxial film having a low doping concentration of nitrogen donors which is suitable for power devices by the liquid phase epitaxy (LPE) method on a SiC substrate having a diameter of at least 2 inches which is practical from an industrial standpoint.

From one aspect, the present invention relates to a method of manufacturing a SiC single crystal film by epitaxial growth of a SiC single crystal on a SiC single crystal substrate in a crystal growth furnace equipped with a crucible for housing a SiC solution in a solvent formed from a melt of a material selected from Si metal and a Si-M alloy (wherein M is at least one metal other than Si), a vertically movable crystal holder which holds the SiC single crystal substrate, a main chamber capable of housing the crucible and the crystal holder and having its interior which can be evacuated and adjusted so as to have a desired atmosphere, and a heating means for heating at least the region inside the main chamber where the crucible is disposed.

The method according to the present invention is characterized by comprising the following steps:

an evacuation step by heating at least the region inside the main chamber where the crucible is to be disposed to at least the SiC crystal growth temperature while evacuating the interior of the main chamber in a state in which the material of a melt is not present, thereby reaching a vacuum pressure of $5 \times 10^{-3}$ Pa or lower in the main chamber at the SiC crystal growth temperature;

a SiC solution forming step by disposing the crucible having the material of a melt housed inside it in a predetermined position in the main chamber and heating the crucible to at least the melting point of the material of a melt so as to melt the material in the crucible and dissolve carbon in the resulting melt, thereby forming a SiC solution in the crucible; and a crystal growth step by immersing the SiC single crystal substrate in the SiC solution using the crystal holder and maintaining a supersaturated state at least in the vicinity of the substrate in the SiC solution by supercooling to allow epitaxial growth of a SiC single crystal on the substrate, wherein the interior of the main chamber is not exposed to the ambient atmosphere from the evacuation step through the crystal growth step.

In the present invention, an inert gas means a gas consisting essentially of one or more rare gases (such as argon and helium). The SiC crystal growth temperature means the temperature of the melt in the vicinity of the SiC crystal substrate in the crystal growth step.

In the SiC solution forming step (also referred to below simply as the solution forming step), carbon (C) is preferably supplied to the melt by dissolving it from a carbonaceous crucible such as a graphite crucible so that the melt inside the crucible will not contain undissolved C. However, if a melt which does not contain undissolved C can be formed, all or a portion of the carbon may be charged into the crucible together with other raw materials (Si or Si and M). Alternatively, a hydrocarbon gas may be supplied to the interior of the main chamber, and carbon produced by thermal decomposition of the gas at the surface of the melt may be dissolved in the melt. A plurality of methods of supplying carbon to the melt may also be used together.

The single crystal substrate which is used is a substrate (wafer) made from a SiC single crystal having a desired crystal structure and crystal plane. Namely, in the present invention, a SiC single crystal film is grown by homoepitaxial growth.

When using in a power device, a preferred single crystal substrate is a substrate of a SiC single crystal having 4H—SiC crystal structure. In this case, a preferred substrate has the {0001} plane on the surface of the SiC single crystal substrate with the minute angle of slope which invariably exists being 1 degree or less, namely, it is an on-axis (0001) substrate. As a result, the problem that basal plane dislocations are easily propagated from the substrate to the epitaxial film which is observed when using an off-axis substrate as stated above with respect to the step-controlled epitaxy method is avoided. The on-axis (0001) substrate which is used may be a commercially available product.

In the evacuation step, the main chamber is evacuated while elevating its temperature to at least the SiC crystal growth temperature. As a result, nitrogen ($N_2$) released from components present in the main chamber is nearly completely depleted in this step. Specifically, in the evacuation step, by performing evacuation until the vacuum pressure at the SiC crystal growth temperature in the main chamber becomes $5 \times 10^{-3}$ Pa or lower, the $N_2$ concentration in the main chamber is substantially decreased to 100 ppb or less. Then, the $N_2$ concentration in the main chamber is 100 ppb or lower even in the subsequent SiC solution forming step and the crystal growth step. As a result, in the crystal growth step, nitrogen is prevented from being incorporated into the SiC single crystal film in an amount such that the nitrogen doping concentration exceeds $1 \times 10^{16}/cm^3$.

The heating temperature in the evacuation step is made at least the SiC crystal growth temperature (also referred to below simply as the growth temperature). If the heating temperature is lower than the growth temperature, at the time of temperature increase during crystal growth, impurity gas containing nitrogen is again released into the main chamber, and there is the possibility of this gas being dissolved in the melt. Nitrogen which is dissolved in the melt is incorporated into SiC crystals and become donors, so it becomes difficult to obtain a crystal with a low doping concentration.

Impurity gases which are released into the main chamber are constituted by nitrogen ($N_2$) as well as oxygen ($O_2$), CO, $CO_2$, $CH_4$, $H_2O$, and the like. By evacuating the main chamber in the evacuation step such that the vacuum pressure at the growth temperature is $5 \times 10^{-3}$ Pa or lower, in the same manner as nitrogen ($N_2$), the concentrations of these other impurity components other than nitrogen can be such as to not greatly affect the semiconductor properties of the SiC crystal.

The heating temperature in the evacuation step is preferably made a temperature at least 50° C. higher and more preferably at least 100° C. higher than the growth temperature. By heating to a temperature higher than the growth temperature, gas released at the time of heating to the crystal growth temperature in the subsequent step has been depleted, and impurity gases which are released into the apparatus are substantially absent.

The interior of the main chamber is preferably adjusted to be an inert gas atmosphere having a pressure of from 6 kPa to 1 MPa by introducing an inert gas consisting of at least one rare gas with an impurity $N_2$ concentration of 100 ppb or lower by at latest the start of epitaxial growth of a SiC single crystal in the crystal growth step. By doing so, compared to the case in which crystal growth is carried out in a vacuum, vaporization of the melt during crystal growth is suppressed and crystal growth is stabilized. In addition, nitrogen ($N_2$) contained in the gas introduced for forming an inert gas atmosphere is prevented from being incorporated as a dopant to such a degree that the nitrogen doping concentration in the SiC single crystal film which is grown exceeds a concentration of $1 \times 10^{16}/cm^3$.

The pressure inside the main chamber can be made higher than atmospheric pressure. In this case, vaporization of the solvent is further suppressed, and marked problems with respect to inert gas do not develop. However, the apparatus becomes large in order to achieve a pressure of higher than 1 MPa. Therefore, from the standpoint of practicality, the upper limit on the pressure inside the main chamber is preferably made 1 MPa.

The atmosphere inside the main chamber may be made the above-described inert gas atmosphere from the start of or during the solution forming step. In any case, after the evacuation step, the atmosphere inside the main chamber is preferably made a vacuum or an inert gas atmosphere having the above-mentioned low nitrogen concentration, and the nitrogen concentration in the atmosphere is preferably maintained at no higher than 100 ppb. Accordingly, during the period from the evacuation step until the completion of the crystal growth step, the ambient atmosphere is prevented from entering into the main chamber so that the crucible and the contents thereof are prevented from contacting the ambient atmosphere.

If the impurity nitrogen ($N_2$) concentration in the inert gas introduced into the main chamber exceeds 100 ppb, even if the evacuation step prior to forming a melt is performed such that gas released at the time of a temperature increase is removed from the furnace, the melt is contaminated by impurity nitrogen in the introduced inert gas. As a result, nitrogen is incorporated into the crystal, and it becomes difficult to obtain a crystal in which the nitrogen doping concentration is a low value of $1 \times 10^{16}/cm^3$ or lower. If the inert gas which is used undergoes a refining process until the nitrogen concentration is 100 ppb or lower, the concentration of other impurity components is also decreased to the extent that they do not significantly change the semiconductor properties of the SiC crystal.

The solution forming step is preferably carried out while capturing impurity gas components including $N_2$ by a getter material disposed inside the main chamber. By disposing a getter material inside the main chamber, it is possible to reduce the level of gas remaining in the apparatus due to gas released from materials inside the main chamber during a temperature increase to a particularly low level. As described below, this getter material can also be used in the evacuation step.

The main chamber preferably has a heat insulating material which surrounds the crucible which is disposed at a predetermined position in its interior, whereby the heating efficiency of the crucible is increased.

The present invention provides a SiC semiconductor device which is manufactured using an epitaxial film-coated SiC single crystal wafer having an SiC single crystal film manufactured by the above-described method on a SiC single crystal substrate.

From another standpoint, the present invention relates to a manufacturing apparatus for SiC single crystal films which includes a crystal growth furnace capable of forming a SiC single crystal film by epitaxial growth of a SiC single crystal on a SiC single crystal substrate, wherein the apparatus is characterized in that the crystal growth furnace has the following:

a crucible capable of housing a SiC solution in a solvent which is a melt of a material selected from Si metal and a Si-M alloy (wherein M is at least one metal other than Si), a crystal holder capable of holding a SiC single crystal substrate and lowering into and raising from the interior of the crucible, a main chamber capable of housing the crucible and the crystal holder, a heating means capable of heating at least the region inside the main chamber where the crucible is disposed, a cooling means capable of cooling at least a portion of the SiC solution so as to make it possible to perform epitaxial growth of a SiC single crystal, an evacuation means capable of maintaining the pressure inside the main chamber at $5 \times 10^{-3}$ Pa or below, and a gas supply means which makes it possible to adjust the interior of the main chamber to be an inert gas atmosphere which has a pressure of 6 kPa-1 MPa and which consists essentially of at least one rare gas having its concentration of impurity $N_2$ controlled to 100 ppb or lower.

Preferably, this manufacturing apparatus further includes the following:

an auxiliary chamber which is disposed adjacent to the main chamber and which can house the crucible, a gate valve which is disposed between the auxiliary chamber and the main chamber and which can make the interior of the auxiliary chamber atmospheric pressure even when the pressure inside the main chamber is $10^{-3}$ Pa or loer, and a transport means which can transport the crucible between the main chamber and the auxiliary chamber without exposing it to the ambient atmosphere.

A getter material for removing impurities including $N_2$ remaining in the main chamber can preferably be disposed in the main chamber of the manufacturing apparatus.

According to the present invention, it is possible to stably grow a SiC epitaxial film having a low doping concentration which is suitable for power devices on a large SiC substrate having a diameter of at least 2 inches using the LPE method.

EMBODIMENTS OF THE INVENTION

Figure 1:
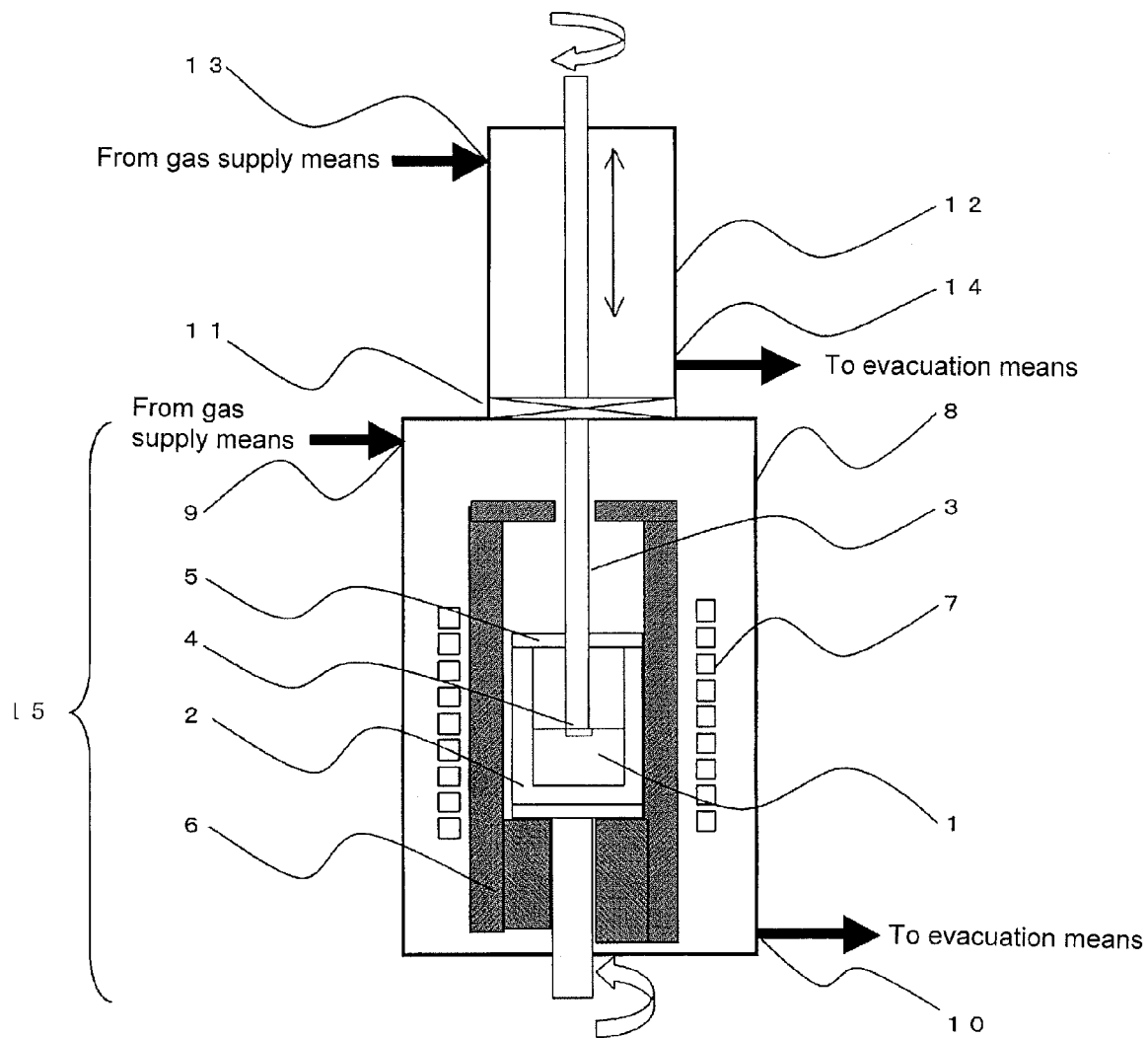
FIG. 1 is a schematic cross-sectional view showing the structure of a manufacturing apparatus according to the present invention.

The present inventors performed investigations of a method capable of stably forming a high purity epitaxial film having a low doping concentration suitable for power devices on a SiC substrate having a diameter of at least 2 inches by the LPE method which is a method capable of epitaxial growth of a SiC single crystal having few defects.

As a result, they found that prior to heating raw materials in a crucible inside a main chamber to form a melt, if the interior of the main chamber is heated in an evacuated state to a temperature equal to or higher than the growth temperature (of SiC crystals), it is possible to obtain a SiC epitaxial film having a low doping concentration of nitrogen donors of $1 \times 10^{16}/cm^3$ or lower.

In the manufacture of SiC single crystals by the LPE method, the sources of impurity nitrogen are thought to be (1) impurity nitrogen in the raw material to form a melt (Si or a Si alloy), (2) impurity nitrogen in carbon, and (3) nitrogen remaining in the atmosphere inside the manufacturing apparatus and specifically inside the main chamber. Of these, it is possible to substantially suppress nitrogen impurity in (1) the raw material for a melt and (2) carbon by using ultrahigh purity Si material for semiconductors and ultrahigh purity carbon. In this case, the main source of nitrogen becomes (3) nitrogen remaining in the atmosphere inside the manufacturing apparatus.

Nitrogen remaining in the atmosphere inside the manufacturing apparatus dissolves in the melt which is a solvent during the SiC solution forming step and is incorporated into the SiC crystal which is crystallized out as a solid phase in the crystal growth step. The nitrogen source remaining in the atmosphere is nitrogen contained as an impurity in an inert gas such as argon or helium which is introduced into the main chamber and nitrogen in the gas which is released from members (including heat insulating materials) in the main chamber at the time of a temperature increase.

As a result of investigation, it was found that nitrogen in the gas which is released from members such as heat insulating materials inside the main chamber at the time of a temperature increase greatly influences the doping concentration of an epitaxial film. Accordingly, in order to grow a SiC crystal having a low doping concentration of nitrogen donors, it is necessary to eliminate the influence of this released gas. Even if the main chamber is heated and evacuated, release of gas from the members continues for a considerable length of time, but it finally decreases and stops. In the past, raw materials were melted while this gas release was continuing. Therefore, impurity nitrogen gas dissolved in the melt and incorporated into a SiC crystal being grown, so it was not possible to obtain crystals having a low doping concentration.

In the present invention, the main chamber is heated while evacuating it until gas released from the members is substantially depleted. This depletion of released gas can be determined from the degree of vacuum at the growth temperature in the main chamber. After depleting released gas in this manner, a crucible charged with a raw material is disposed in a predetermined position in the main chamber without exposing the interior of the main chamber to the ambient atmosphere, and the raw material in the crucible is melted. As a result, the influences of gas released from the members inside the main chamber can be essentially eliminated, and a SiC crystal with low doping concentration can be grown on a substrate.

Specifically, in a state in which a raw material to form a melt is not present, at least the region in the main chamber where the crucible is to be disposed is heated to raise its temperature to at least the growth temperature (SiC crystal growth temperature) while evacuating the interior of the main chamber. This heating is continued until the vacuum pressure in the main chamber at the growth temperature is $5 \times 10^{-3}$ Pa or lower (evacuation step).

Next, a crucible containing a material (raw material for a melt) selected from Si metal and a Si-M alloy (where M is at least one metal other than Si) is disposed at a predetermined position in the main chamber. The crucible is heated to at least the melting point of the raw material such that a melt is formed and carbon is dissolved in the resulting melt to form a SiC solution in the crucible (SiC solution forming step).

Then, using a crystal holder, a SiC single crystal substrate is immersed in the SiC solution, and a supersaturated state is created by supercooling at least in the vicinity of the SiC single crystal substrate in the SiC solution so as to cause epitaxial growth of a SiC single crystal on the SiC single crystal substrate (crystal growth step).

The interior of the main chamber is not exposed to the ambient atmosphere from the evacuation step to the crystal growth step.

By employing such a manufacturing method, the $N_2$ concentration inside the main chamber when carrying out the SiC solution forming step and the crystal growth step is made 100 ppb or lower, and epitaxial growth of a SiC single crystal having a nitrogen doping concentration of $1 \times 10^{16}/cm^3$ or lower can be carried out on a SiC single crystal substrate. This technique can be easily applied to a wafer having a diameter of 2 inches or larger. By carrying out crystal growth in an inert gas atmosphere at a pressure of at least 6 kPa, marked vaporization of the melt is avoided, and stable crystal growth is achieved.

Below, a manufacturing method according to the present invention will be explained in more detail.

First, in a state in which the raw material for a melt is not present, at least the region inside the main chamber where the crucible is to be disposed is heated to a temperature which is equal to or higher than the growth temperature while evacuating the main chamber to a vacuum. This procedure is continued until the vacuum pressure inside the main chamber at the growth temperature reaches $5 \times 10^{-3}$ Pa or below.

Here, the region where the crucible is to be disposed means a space which is occupied by a crucible for forming a SiC solution when the crucible is disposed in position. When a heat insulating material is disposed so as to surround the crucible for heat retention of the crucible, the region surrounded by the heat insulating material corresponds to the region in which the crucible is to be disposed.

In order to prevent the raw material for a melt from melting during evacuation, the evacuation step is carried out in a state in which the raw material for a melt is not present. Specifically, the evacuation step can be carried out before a crucible is disposed in the main chamber or in a state in which an empty crucible which does not contain the raw material is disposed at a predetermined position in the main chamber. The latter case is advantageous in that the amount of impurity gases which are released from the crucible in the subsequent steps can be sufficiently lowered. In this case, after the evacuation step, the crucible is moved if necessary and is cooled to a temperature lower than the melting temperature of the raw material for a melt. The cooled crucible is then charged with the raw material for a melt and is disposed in a predetermined position in the main chamber before the SiC solution forming step is carried out.

Depletion of released gas in the main chamber in the evacuation step can be determined by monitoring the change over time in the degree of vacuum in the main chamber with a vacuum gauge installed on the vacuum exhaust line for the main chamber. Namely, when the vacuum pressure in the main chamber at the growth temperature becomes $5 \times 10^{-3}$ Pa or less, it is considered that the release of gas from members inside the main chamber (the inner walls, the heating means, and optionally the heat insulating material and the crucible) is substantially depleted.

The heating temperature during evacuation in the evacuation step is made equal to or higher than the growth temperature employed during the crystal growth step. It is preferably a temperature at least 50° C. higher and more preferably at least 100° C. higher than the growth temperature. By carrying out the evacuation step at a temperature higher than the growth temperature, gas released at the time of heating to the crystal growth temperature in the subsequent steps is depleted with a certainty, and the amount of impurity gas released into the apparatus in those steps is minimized.

In the evacuation step, by disposing in the main chamber a getter material which has the ability to capture at least nitrogen gas, it is possible to remove minute amounts of residual gas prior to crystal formation. A getter material which is used can be selected from metals having a high affinity for nitrogen such as Ti, Cr, V, and Zr and alloys thereof. These materials can capture oxygen gas and the like in addition to nitrogen. The getter material can also be used in the subsequent SiC solution forming step. Namely, the getter material can be used in one or both of the evacuation step and the SiC solution forming step.

When the getter material is disposed inside the main chamber in the evacuation step, a suitable place for it to be disposed is a location where the temperature is higher than the temperature at which the getter material exhibits its gas capturing ability (approximately 500° C.) and is a temperature at which the getter material itself does not melt. When the heating means is an induction heating using a high frequency coil, an example of such a location is one which is distant from the coil and which is not directly inductively heated by the coil. When a heat insulating material is disposed around the location where the crucible is disposed, the getter material can be disposed in the outer periphery region of the heat insulating material.

The getter material can be disposed in the main chamber after the completion of the evacuation step (after released gas has been depleted) and before the start of the SiC solution forming step. In this case, it is possible to dispose the getter material in the region which is heated by a heating means such as a high frequency coil to cause the getter material itself to melt inside the main chamber at the same time as the melting of the raw material in the solution forming step. In this case, due to melting of the getter material, the ability of the getter material to capture impurity gas is greatly increased compared to the case in which it does not melt. Placing the getter material in the region which is heated can be carried out by, for example, moving a vessel containing the getter material from an auxiliary chamber to the main chamber utilizing a mechanism for raising and lowering the single crystal substrate or a mechanism for disposing the crucible in the region to be heated. By so doing, the getter material can be placed in position without exposing the interior of the main chamber having a minimized concentration of impurity nitrogen to the ambient atmosphere.

The interior of the main chamber is preferably made an inert gas atmosphere having a pressure adjusted to be between 6 kPa and 1 MPa by introducing an inert gas constituted by at least one rare gas and having an impurity $N_2$ concentration of 100 ppb or lower before the start of epitaxial growth of a SiC single crystal in the crystal growth step. From the standpoint of ease of operation, a pressure in the range of 6 kPa to 0.15 MPa is more preferred. The operation of making the interior of the main chamber an inert gas atmosphere is preferably carried out prior to melting of the raw material for a melt in the solution forming step, whereby evaporation of the melt can be minimized. Here, as an example, the case will be explained in which this operation of introducing an inert gas into the main chamber is carried out following the evacuation step.

The inert gas which is used is one having an impurity nitrogen ($N_2$) concentration of 100 ppb or lower and preferably 10 ppb or lower. By introducing an inert gas having a nitrogen concentration of 10 ppb or lower, it is possible to grow a SiC single crystal having an extremely low doping concentration on the same order as when crystal growth is carried out in a vacuum.

Such a high purity inert gas can be obtained by refining a commercially available gas in a gas refiner. The concentration of impurity nitrogen in the gas can be determined by an ultrahigh accuracy gas analyzer installed in a gas supply line.

The impurity nitrogen ($N_2$) concentration in the main chamber after the completion of the evacuation step can be directly determined by a mass spectrometer to confirm that it is 100 ppb or lower. When an inert gas is subsequently introduced, it can be confirmed that there is no change in the impurity nitrogen ($N_2$) concentration contained in the gas between the inlet side and the outlet side by the above-described ultrahigh accuracy gas analyzer.

After an inert gas atmosphere having a prescribed pressure and a determined impurity concentration is achieved inside the main chamber, the crucible containing the raw material for a melt is disposed at a predetermined position in a region surrounded by the heat insulating material in the main chamber.

A solution forming step is then carried out in which the crucible is heated to at least the melting temperature of the raw material to melt the raw material and form a melt and carbon is dissolved in the melt to form a SiC solution in the crucible.

The solvent for the SiC solution is a melt of Si metal or a Si-M alloy. There is no particular limitation on the type of metal M as long as a liquid phase (solution) which is in thermodynamic equilibrium with the SiC (solid phase) can be formed. Examples of a suitable metal M include Ti, Mn, Cr, Co, V, Fe, and the like. Ti and Mn are preferred, and Ti is particularly preferred. When the composition of the Si-M alloy is expressed as $Si_{1-x}M_x$, a preferred atomic ratio of alloying element M is $0.1 \leq x \leq 0.25$ when M is Ti and $0.1 \leq x \leq 0.7$ when M is Mn.

Carbon (C) can be supplied to the melt by (1) dissolving the crucible, (2) dissolving a solid which is supplied from the exterior, and/or (3) introducing a hydrocarbon gas. In method (1), a crucible made of ultrahigh purity graphite or a crucible having at least its inner surface coated with ultrahigh purity SiC may be used. In this method, undissolved C is not present in the melt, and a decrease in yield due to crystallization on undissolved C is avoided. In method (2), ultrahigh purity carbon or graphite can be added to the raw material for a melt in the crucible. In this case, it is preferable to adequately heat the melt so that the supplied carbon is completely dissolved in the melt. In method (3), a hydrocarbon gas such as methane or propane is blown into the furnace or into the melt, and carbon produced by pyrolysis of the gas is dissolved in the melt. Any one of these methods or two or more of these methods can be used.

Dissolution of C is carried out so as to obtain a SiC solution having a concentration close to the saturated concentration. Then, a SiC single crystal substrate held by the crystal holder is immersed in the SiC solution. The speed and depth of immersion can be suitably set taking into consideration the shape of the crucible and the shape of the SiC single crystal substrate. When forming a SiC epitaxial film for a power device, a SiC single crystal substrate made of a 4H—SiC single crystal having a surface corresponding to the {0001} plane in which a minute slope angle which is unavoidably present is 1 degree or less (namely, an on-axis (0001) substrate) is preferably used.

After the SiC single crystal substrate is immersed to a predetermined position in the SiC solution (usually a position extremely close to the liquid surface), the SiC solution at least in the vicinity of the SiC single crystal substrate is made supersaturated by supercooling to carry out the crystal growth step by allowing epitaxial growth of a SiC single crystal to occur on the SiC single crystal substrate. As stated above, before starting this crystal growth step, the atmosphere in the main chamber is preferably made an inert gas atmosphere.

Cooling to perform supercooling can be carried out in the conventional manner. Cooling can be achieved by controlling heating by the heating means so that the temperature in a particular region of the crucible is lower than in other regions. Alternatively, it is possible to cool the vicinity of the single crystal substrate using a cooling medium. A cooling means employed is a temperature-controlling mechanism provided in the heating means in the former case and a cooling mechanism with a cooling medium in the latter case. As an example of the latter cooling method, the single crystal substrate can be cooled from its rear surface by passing a cooling medium through the interior of the crystal holder, whereby the melt in the vicinity of the substrate is cooled through the cooled substrate.

A supersaturated state which provides the driving force for crystal growth can be created not only by a method in which it is realized by providing the above-described temperature difference in the melt, but it can also be realized by a method in which the entire SiC solution in which a seed crystal is immersed is gradually cooled.

In accordance with the present invention, by carrying out the formation of a SiC solution and the growth of a SiC single crystal after adequately evacuating the interior of a manufacturing apparatus until released gas is depleted, a SiC single crystal film having a low doping concentration can be stably manufactured on a SiC single crystal wafer, and hence practical application of SiC to power devices can be realized.

FIG. 1 schematically shows one example of a manufacturing apparatus which can be used to manufacture a SiC single crystal film by the LPE method according to the present invention. The illustrated manufacturing apparatus has a crystal growth furnace 15, which has a body constituted by a main chamber 8, and an auxiliary chamber 12. A gate valve 11 is provided between the main chamber 8 and the auxiliary chamber 12, so the atmospheres in the main chamber 8 and the auxiliary chamber 12 can be adjusted independently from each other.

A crucible 2 which can house a melt 1, a crystal holder 3 which can move up and down, a heat insulating material 6 which surrounds the crucible 2, and a high frequency coil 7 which is a heating means for the crucible 2 are disposed inside the main chamber 8.

At the time of crystal growth, the crystal holder 3 is lowered such that a SiC single crystal substrate 4 held at its end is immersed in the melt 1 in the crucible 2. The melt 1 is a SiC solution prepared by dissolving C in a solvent in the form of molten Si or a molten Si alloy. As shown in the figure, the crucible 2 and the crystal holder 3 can be independently rotated. The rotational directions of the crucible and the crystal holder may be the same as or opposite from each other. The rotation may include periodic changes in the rotational speed and/or intermissions of rotation.

The crucible 2 is closed off by a crucible lid 5 through which the crystal holder 3 passes. The outer periphery of the crucible 2 is surrounded by a heat insulating material 6 for maintaining the temperature in the crucible. A high frequency coil 7 for inductively heating the crucible 2 and the melt 1 is disposed on the outer periphery of the heat insulating material 6.

When carrying out crystal growth, by adjusting the number and spacing of the windings of the high frequency coil 7 and its positional relationship with respect to the crucible 2, a temperature difference in the vertical direction of the melt can be provided so that the temperature of the location where the substrate is immersed can be made lower than in the other locations. As a result, a supersaturated state of the SiC solution due to supercooling can be created in the vicinity of the SiC substrate 4. In this case, the high frequency coil itself also serves as a cooling means for a specified portion of the melt 2.

The crucible 2, the heat insulating material 6, and the high frequency coil 7 reach a high temperature, so the inner wall of the main chamber 8 can be water cooled by a water cooling system, and the interior of the high frequency coil 7 is also water cooled. A cooling mechanism employing water or a gas may also be incorporated into the crystal holder 3 in order to cool the SiC substrate 4 from its rear surface (the surface on the opposite side from the crystal growth interface). As a result, the melt 1 in the vicinity of the substrate can be cooled. In this case, the cooling mechanism for the crystal holder serves as a cooling mechanism for locally cooling the melt.

The main chamber 8 has a gas inlet 9 connected to a gas supply means and a gas evacuation port 10 connected to an evacuation means so that the interior of the main chamber 8 can be evacuated and its atmosphere can be controlled. The evacuation means has the ability to maintain the pressure inside the main chamber 8 at $5 \times 10^{-3}$ Pa or below and the $N_2$ concentration at 100 ppb or below. The gas supply means has the ability to supply an inert gas which forms an inert gas atmosphere constituted by at least one rare gas such as argon having a pressure of from 6 kPa to 1 MPa inside the main chamber 8 with the impurity $N_2$ concentration adjusted to 100 ppb or below. As stated above, this gas supply means can possess an inert gas source and a gas refiner. An ultrahigh accuracy gas analyzer is preferably disposed downstream of the gas refiner in the gas supply line so as to determine the impurity concentration and particularly the nitrogen ($N_2$) concentration in the supplied inert gas.

Although not shown, a plurality of pyrometers may be disposed so as to pass through gaps in the high frequency coil 7 and through the heat insulating material 6 to measure the temperature of the side wall of the crucible 2 at a plurality of points along its height.

The gate valve 11 located between the main chamber 8 and the auxiliary chamber 12 disposed above it makes it possible to maintain the pressure inside the auxiliary chamber 12 at atmospheric pressure even when the pressure inside the main chamber 8 is $10^{-3}$ Pa or below. Like the main chamber 8, the auxiliary chamber 12 has its inner wall which is water cooled and it has a gas inlet 13 and a gas evacuation port 14 which are independent of those of the main chamber 8 and are respectively connected to a gas supply means and an evacuation means. Using the auxiliary chamber 12 and the gate valve 11, a crucible 2 containing a solid raw material for a melt can be moved from the auxiliary chamber 12 to the main chamber 8 through the gate valve 11 without the inside of the main chamber 8 being exposed to the ambient atmosphere. In this case, after the crucible 2 containing the raw material for a melt is disposed in the auxiliary chamber 12, it is preferable to sufficiently evacuate the auxiliary chamber 12 to vacuum and then introduce a high purity inert gas like that described above into the auxiliary chamber 12 so as to make a high purity inert gas atmosphere inside this chamber.

A getter material may be disposed in the main chamber 8 in order to remove impurities including $N_2$ remaining in its interior. The getter material may be disposed on the outer periphery of the heat insulating material 6 in the main chamber 8 from the start of the heating of the inside of the main chamber 8 in the evacuation step. Alternatively or in addition, the getter material can be disposed in the auxiliary chamber 12, and after the interior of the main chamber 8 is evacuated to a certain degree under heating, the getter material can be moved from the auxiliary chamber 12 to a predetermined position in the main chamber 8.

A manufacturing apparatus according to the present invention can have a structure in which the auxiliary chamber 12 and the gate valve 11 are omitted. In this case, the crucible 2 and/or a getter material can be movable inside the main chamber 8 between a first location on the outside of the heat insulating material 6 where it is difficult for the crucible to be affected by heat from the high frequency coil 7 which is a heating means and a second position which is a predetermined position for heating inside the heat insulating material 6. This case has the disadvantages that the volume of the main chamber 8 increases and it is necessary to expose the main chamber 8 to the ambient atmosphere each time processing is carried out. Accordingly, an auxiliary chamber 12 and a gate valve 11 are preferably provided as described above.

The heat insulating material 6 which is used may be a graphite fiber-based molded heat insulating material prepared from general purpose carbon fibers of coal pitch origin. This molded heat insulating material is manufactured by impregnating pitch-derived carbon fibers, which are prepared by spinning coal pitch followed by calcination, with a resin having a high rate of carbonization followed by molding, curing, carbonization, and graphitization. In order to prevent particles or the like from scattering from this heat insulating material and contaminating the melt, the heat insulating material is preferably housed in a graphite vessel or a graphite vessel having its surface coated with a heat resistant ceramic such as SiC or TaC. When carrying out crystal growth with a large diameter of at least 2 inches, it is preferable to use a heat insulating material from the standpoint of maintaining a high heating efficiency.

In a liquid phase growth method for a SiC single crystal film according to the present invention, members inside the main chamber including the heat insulating material 6 are previously heated while evacuating the chamber to a vacuum to substantially entirely discharge gas released from the members to outside the apparatus. The behavior of the released gas can be observed by the change over time in the degree of vacuum measured by a vacuum gauge installed in the evacuation line. If necessary, the concentration of each impurity can be separately determined by a mass spectrometer.

The materials used to form members of a SiC single crystal manufacturing apparatus according to the present invention other than those described above may be the same as those utilized in an apparatus for growing SiC single crystals by the LPE method or the solution growth method which have been used in the past.

EXAMPLES

The present invention will be explained more concretely while referring to examples. The examples are for the purpose of illustrating the present invention and are not intended to be limiting.

In below-described Examples 1-8, SiC epitaxial growth experiments on a SiC single crystal substrate were carried out using the SiC single crystal film manufacturing apparatus schematically shown in FIG. 1.

This manufacturing apparatus has a graphite crucible 2 (inner diameter of 100 mm) and a crucible lid 5 made of the same material, and the outer periphery of the graphite crucible 2 is surrounded by a heat insulating material 6 (the above-described graphite fiber-based molded heat insulating material manufactured from coal pitch-derived carbon fibers and a resin having a high rate of carbonization). In the same manner as the crucible lid 5, the heat insulating material 6 also has a removable lid through which a crystal holder 3 passes. A high frequency coil 7 for inductive heating is disposed on the outer periphery of the heat insulating material 6. A main chamber 8 which houses the above members is a cylindrical body made of stainless steel and including a water cooling system incorporated in its wall. The atmosphere inside the main chamber 8 can be adjusted using a gas inlet 9 and an evacuation port 10. The crucible 2 is rotatably supported by a rotating shaft which passes through the main chamber 8 and the heat insulating material 6. An auxiliary chamber 12 is a cylindrical body made of stainless steel and having a size which can house the crucible 2, and it includes a water cooling system incorporated in its wall.

In the growth experiments of the examples, Si (ultrahigh purity Si with a purity of 11N) was placed inside the graphite crucible 2 and melted by high frequency induction heating. Carbon was dissolved in the melt by dissolution of the graphite crucible. The melt was heated at a predetermined temperature for approximately two hours in order to ensure that carbon adequately dissolved in the Si melt which constituted a solvent.

After a SiC solution having SiC dissolved close to its saturation concentration was formed as the melt 1 in this manner, a SiC single crystal substrate 4 held at the tip of the crystal holder 3 was immersed in the vicinity of the surface of the melt 1, and the immersed state was maintained for a predetermined length of time to cause growth of a SiC single crystal to occur by the temperature difference method. A commercially available SiC single crystal wafer which had a diameter of 2 inches and a 4H—SiC crystal structure was used as the substrate. This substrate had a surface corresponding to the {0001} plane having an unavoidable minute angle of slope of 1 degree or less, namely, it was an on-axis (0001) substrate. During crystal growth, the crucible 2 and the crystal holder 3 were rotated in opposite directions from each other (the rotational speed of each was 5 rpm).

Helium gas which had different impurity $N_2$ concentrations and which was refined by passing through a commercially available gas refiner provided in the gas supply line was used as an inert gas. The impurity nitrogen concentration in this inert gas was determined using an ultrahigh accuracy gas analyzer (Kontrol Analytik gas analyzer Model K4000) installed in the gas supply line downstream of the gas refiner. The vacuum in the main chamber was measured by a commercially available ionization vacuum gauge provided in the gas exhaust line.

In the examples, before disposing the crucible 2 in the main chamber 8, an evacuation step in which the main chamber 8 having the heat insulating material 6 and the high frequency coil 7 disposed therein was heated while evacuating to a vacuum was carried out under different conditions. During the evacuation step, the crucible 2 containing Si which was the raw material for a melt was held in an inert gas atmosphere at atmospheric pressure in the auxiliary chamber 12 (using the same inert gas as used for crystal growth).

After the completion of the growth experiment, the crystal holder 3 was raised and the SiC single crystal substrate was recovered from the melt 1. The melt in the crucible was solidified by cooling it to room temperature. The recovered single crystal substrate was washed with hydrofluoric/nitric acid ($HF+HNO_3$) to remove any solids formed by solidification of the melt adhering thereto. The doping concentration of donors in the SiC epitaxial film newly formed on the single crystal substrate was measured by C-V (capacitance and voltage) measurement using an apparatus manufactured by Four Dimensions, Inc. The measured results are shown in Table 1. In Table 1, the case in which the doping concentration was $1 \times 10^{16}/cm^3$ or lower was evaluated as "O" (acceptable), and a higher doping concentration was evaluated as "X" (not acceptable).

Example 1

Before the growth experiment, an evacuation step was carried out in which members inside the main chamber including the heat insulating material were heated under a vacuum. The vacuum worsened with the start of temperature increase. Therefore, when the vacuum inside the main chamber reached $1 \times 10^{-1}$ Pa or above, the rise in temperature was stopped with heating being continued so as to maintain that temperature, and waiting was performed in that conditions until the vacuum pressure returned to $1 \times 10^{-2}$ Pa or below. By repeating this process, the final temperature reached in heating was made 1750° C., which was 50° C. higher than the growth temperature of 1700° C. Temperature measurement was carried out by measuring with a pyrometer the temperature of the rear surface of the portion of the crystal holder (made of graphite) to which a single crystal substrate attached. When the heating temperature decreased to the growth temperature of 1700° C., the vacuum pressure at 1700° C. was $1 \times 10^{-4}$ Pa. When heating was stopped and the interior of the apparatus was cooled, the vacuum pressure at room temperature became $1 \times 10^{-5}$ Pa.

The gate valve was then opened, and the crucible previously disposed in the auxiliary chamber and containing ultrahigh purity Si was placed into the main chamber using the crystal holder. Then, while evacuating the interior of the main chamber, heating of the interior of the chamber was recommenced such that the temperature of the material in the crucible was increased. Just before forming a Si melt (at approximately 1380° C.), a helium gas having a nitrogen content of 100 ppb as an impurity was introduced into the main chamber until the pressure therein became atmospheric pressure ($1 \times 10^5$ Pa). The Si melt which was formed was held for two hours at 1700° C. to dissolve carbon from the crucible and form a SiC solution. A temperature gradient in the vertical direction of 15° C./cm (the upper surface was at a lower temperature) was formed to a depth of approximately 2 cm from the surface of the melt by adjusting the relative positions of the high frequency coil and the graphite crucible. The temperature in the vicinity of the surface of the melt which was in the vicinity of the substrate was 1700° C., but the temperature from approximately 2 cm from the surface to the bottom of the melt was 1730° C.

A SiC single crystal substrate secured to the tip of the crystal holder was then lowered into the apparatus through the auxiliary chamber. The substrate was immersed for 3 hours in the vicinity of the surface of the Si melt (SiC solution) to allow epitaxial growth of a SiC single crystal film to occur on the substrate. Then, crystal growth was completed by raising the crystal holder and removing the single crystal substrate from the melt.

Example 2

The temperature reached by heating in the evacuation step was made 1700° C., which was the same as the growth temperature. The vacuum pressure in the main chamber at 1700° C. was $5 \times 10^{-3}$ Pa. A SiC epitaxial film was grown on a single crystal substrate in a manner which was otherwise the same as in Example 1.

Example 3

The heating temperature reached in the evacuation step was made 1800° C., which was 100° C. higher than the growth temperature of 1700° C. When the heating temperature subsequently fell to the growth temperature of 1700° C., the vacuum pressure in the main chamber was $1 \times 10^{-4}$ Pa. When heating was stopped and the interior of the apparatus was cooled, the vacuum pressure at room temperature became $1 \times 10^{-5}$ Pa. A SiC epitaxial film was grown on a single crystal substrate in a manner which was otherwise the same as in Example 1.

Example 4

A SiC epitaxial film was grown on a single crystal substrate in the same manner as in Example 1 except that before the gate valve was opened and a crucible containing ultrahigh purity Si in the auxiliary chamber was placed into the main chamber, a getter material (made of metallic Ti and metallic Cr) for capturing impurity gas components was disposed in a position on the outer periphery of the heat insulating material in the main chamber.

Example 5

A SiC epitaxial film was formed on a single crystal substrate in the same manner as in Example 1 except that just before forming a Si melt (at approximately 1380° C.), a reduced pressure atmosphere of 0.1 MPa of argon (having a nitrogen impurity content of 100 ppb) was formed.

Example 6

A SiC epitaxial film was formed on a single crystal substrate in the same manner as in Example 1 except that just before forming a Si melt (at approximately 1380° C.), a reduced pressure atmosphere of 6 kPa of helium (having a nitrogen impurity content of 100 ppb) was formed.

Example 7

A SiC epitaxial film was formed on a single crystal substrate in the same manner as in Example 1 except that just before forming a Si melt (at approximately 1380° C.), a reduced pressure atmosphere of 1 MPa of helium (having a nitrogen impurity content of 100 ppb) was formed.

Example 8

A SiC epitaxial film was formed on a single crystal substrate in the same manner as in Example 1 except that just before forming a Si melt (at approximately 1380° C.), the atmosphere was made helium at atmospheric pressure (having a nitrogen impurity content of 10 ppb).

Comparative Example 1

A crucible containing ultrahigh purity Si was disposed in position in a manufacturing apparatus without carrying out an evacuation step (heating of the interior of the main chamber under a vacuum) prior to a growth experiment. The interior of the main chamber was then evacuated to $1 \times 10^{-4}$ Pa or less at room temperature, and the interior of the apparatus was replaced with helium (having a nitrogen impurity content of 10 ppb) such that the pressure thereof was made atmospheric pressure.

After heating to the growth temperature of 1700° C. and forming a Si melt, this temperature was maintained for 2 hours. The temperature gradient in the melt was the same as in Example 1. Next, a SiC single crystal substrate secured to the tip of a crystal holder was lowered into the main chamber through the auxiliary chamber, it was immersed for 3 hours in the vicinity of the surface of the Si melt, whereby a SiC epitaxial film was grown on the substrate. The crystal holder was then raised, and the single crystal substrate was separated from the melt to complete crystal growth.

Comparative Example 2

A SiC epitaxial film was grown on a single crystal substrate in the same manner as in Example 1 except that the temperature which was reached by heating in the evacuation step was made 1600° C., which was 100° C. lower than the growth temperature of 1700° C., and the vacuum pressure reached in that step was made $1 \times 10^{-4}$ Pa.

Comparative Example 3

A SiC epitaxial film was grown on a single crystal substrate in the same manner as in Example 1 except that just before forming a Si melt (at approximately 1380° C.), the atmosphere was replaced by helium at atmospheric pressure (having a nitrogen impurity content of 1 ppm).

TABLE 1

| | Prior heating with evacuating to vacuum | | Growth temp. (° C.) | Gas atmosphere, pressure during crystal growth | Evaporation of solvent | Impurity concentration in introduced gas | Evaluation of crystal | |
|---|---|---|---|---|---|---|---|---|
| | Yes/No | Heating temp. (° C.) | | | | | Doping concentration (cm$^{-3}$) | Evaluation |
| Example 1 | Yes | 1750 | 1700 | He, 0.1 MPa | almost none | 100 ppb | $7 \times 10^{15}$ | O |
| Example 2 | Yes | 1700 | 1700 | He, 0.1 MPa | almost none | 100 ppb | $1 \times 10^{16}$ | O |
| Example 3 | Yes | 1800 | 1700 | He, 0.1 MPa | almost none | 100 ppb | $4 \times 10^{15}$ | O |
| Example 4 | Yes | 1750 | 1700 | He, 0.1 MPa | almost none | 100 ppb | $5 \times 10^{15}$ | O |
| Example 5 | Yes | 1750 | 1700 | Ar, 0.1 MPa | almost none | 100 ppb | $7 \times 10^{15}$ | O |
| Example 6 | Yes | 1750 | 1700 | He, 6 kPa | slight | 100 ppb | $6 \times 10^{15}$ | O |
| Example 7 | Yes | 1750 | 1700 | He, 1 MPa | none | 100 ppb | $9 \times 10^{15}$ | O |
| Example 8 | Yes | 1750 | 1700 | He, 0.1 MPa | almost none | 10 ppb | $5 \times 10^{15}$ | O |
| Compar. Example 1 | No | — | 1700 | He, 0.1 MPa | almost none | 100 ppb | $1 \times 10^{18}$ | X |
| Compar. Example 2 | Yes | 1600 | 1700 | He, 0.1 Mpa | almost none | 100 ppb | $8 \times 10^{16}$ | X |
| Compar. Example 3 | Yes | 1750 | 1700 | He, 0.1 Mpa | almost none | 1 ppm | $4 \times 10^{16}$ | X |

The film thickness after growth for 3 hours was approximately 30 μm for each example.

As can be seen from comparison between Examples 1-3 and Comparative Examples 1-2, according to the present invention, by carrying out an evacuation step before carrying out crystal growth to obtain an adequate vacuum in the main chamber and then placing a crucible containing a raw material for a melt into the main chamber without exposing it to the ambient atmosphere before a SiC solution-forming step and a crystal growth step, dissolution of residual nitrogen ($N_2$) in the melt is suppressed and a SiC crystal having a low doping concentration is obtained.

As can be seen from Example 4, if a getter material is placed inside the main chamber before placing the crucible containing the raw material for a melt into the main chamber and then the raw material for a melt is heated until it melts, the doping concentration of the SiC single crystal film which is formed is further decreased.

From Example 5, it can be seen that the effects of the present invention are obtained regardless of the type of rare gas in the inert gas atmosphere. Examples 6 and 7 show the gas pressure range which can provide the effects of the present invention without problems such as evaporation. As can be seen from Examples 1 and 8 and Comparative Example 3, if the impurity concentration of the introduced inert gas is reduced, a SiC crystal film having a still lower doping concentration can be obtained.

Figure 2:
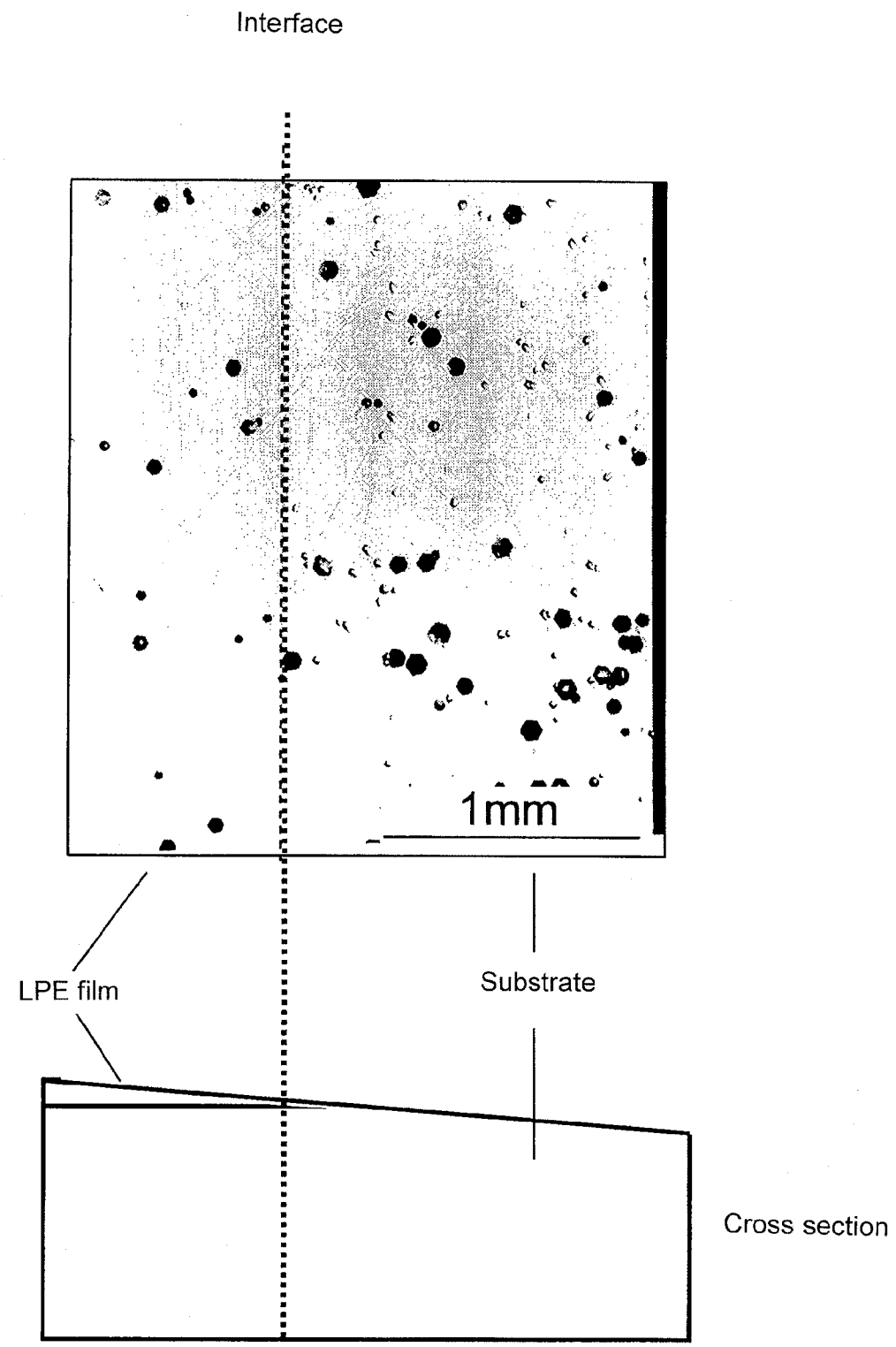
FIG. 2 is an optical photomicrograph showing the results comparing the dislocation density for a SiC epitaxial film formed according to the present invention and a SiC single crystal which is a substrate therefor along with a schematic view of the epitaxial film and the substrate which were observed.

The result of carrying out etching with molten KOH in order to compare the dislocation density in the epitaxial film prepared in Example 1 with the substrate is shown by the optical photomicrograph in FIG. 2. For comparison, the crystal was polished slopewise such that the crystals of the epitaxial film and the substrate were both exposed on the sloping polished surface. Etching with molten KOH can selectively etch dislocations present inside a crystal and visualize them.

From FIG. 2, it was ascertained that an epitaxial film prepared according to the present invention had a reduced dislocation density and hence improved quality compared to a substrate. Thus, according to the present invention, it is possible to stably grow a high quality epitaxial film with a low nitrogen doping concentration suitable for power devices on a SiC substrate with a diameter of at least 2 inches, which was difficult to achieve in the prior art by the LPE method.

The invention claimed is:

1. A method of manufacturing a SiC single crystal film by epitaxial growth of a SiC single crystal on a SiC single crystal substrate in a crystal growth furnace equipped with a crucible for housing a SiC solution in a solvent formed from a melt of a material selected from Si metal and a Si-M alloy (wherein M is at least one metal other than Si), a vertically movable crystal holder for holding the SiC single crystal substrate, a main chamber capable of housing the crucible and the crystal holder and having its interior which can be evacuated and adjusted so as to have a desired atmosphere, and a heating means for heating at least a region inside the main chamber where the crucible is to be disposed, characterized by comprising the following steps:

an evacuation step by heating at least the region inside the main chamber where the crucible is to be disposed to at least an SiC crystal growth temperature while evacuating the interior of the main chamber in a state in which the material for a melt is not present in the main chamber, thereby reaching a vacuum pressure of $5 \times 10^{-3}$ Pa in the main chamber at the SiC crystal growth temperature;

a SiC solution forming step by disposing the crucible having the material for a melt housed inside it in a predetermined position in the main chamber after said evacuation step and heating the crucible to at least the melting point of the material for a melt so as to melt the material in the crucible and dissolve carbon in the resulting melt, thereby forming a SiC solution in the crucible; and a crystal growth step using an LPE method by immersing the SiC single crystal substrate in the SiC solution using the crystal holder and maintaining a supersaturated state at least in the vicinity of the substrate in the SiC solution by supercooling to cause epitaxial growth of a SiC single crystal on the substrate, wherein an SiC single crystal obtained by the epitaxial growth has a doping concentration of nitrogen donors of $1 \times 10^{16}/cm^3$ or lower, obtaining of the doping concentration being a result of said evacuation step, wherein the interior of the main chamber is not exposed to the ambient atmosphere from the evacuation step through the crystal growth step.

2. A method as set forth in claim 1 wherein before starting epitaxial growth of a SiC single crystal in the crystal growth step, the atmosphere inside the main chamber is made an inert gas atmosphere adjusted to a pressure of from 6 kPa to 1 MPa by introducing a gas constituted by at least one rare gas and having an impurity $N_2$ concentration of 100 ppb or lower.

3. A method as set forth in claim 1 wherein the SiC solution forming step is carried out while capturing impurity gas components including $N_2$ with a getter material disposed inside the main chamber.

4. A method as set forth in claim 1 wherein the crystal growth furnace is provided with a heat insulating material inside the main chamber so as to surround the crucible which is disposed at a predetermined position inside the main chamber.

5. A method as set forth in claim 1 wherein the SiC single crystal substrate is made of a SiC single crystal having a 4H—SiC crystal structure.

6. A method as set forth in claim 5 wherein the SiC single crystal substrate has a surface corresponding to a {0001} plane with its minute angle of slope which is unavoidably present being 1 degree or less.

7. A SiC semiconductor device characterized by being manufactured using a SiC single crystal wafer with an epitaxial film which has an SiC single crystal film obtained by the manufacturing method set forth in claim 1 on a SiC single crystal substrate.

* * * * *